United States Patent [19]

Horiuchi et al.

[11] Patent Number: 5,229,213
[45] Date of Patent: Jul. 20, 1993

[54] ALUMINUM NITRIDE CIRCUIT BOARD

[75] Inventors: Michio Horiuchi, Koshoku; Yoichi Harayama; Yukiharu Takeuchi, both of Nagano, all of Japan

[73] Assignee: Shinko Electric Industries Co., Ltd., Nagano, Japan

[21] Appl. No.: 435,944

[22] Filed: Nov. 13, 1989

[30] Foreign Application Priority Data

Nov. 14, 1988 [JP] Japan ................... 63-287137

[51] Int. Cl.$^5$ ............................. B32B 15/04
[52] U.S. Cl. ................... 428/457; 428/688; 428/901
[58] Field of Search ................ 428/901, 457, 688

[56] References Cited

U.S. PATENT DOCUMENTS

| | | |
|---|---|---|
| 4,770,953 | 9/1988 | Horiguchi et al. ............ 428/901 |
| 4,869,925 | 9/1989 | Hiai et al. ..................... 428/901 |
| 4,906,511 | 3/1990 | Sato et al. .................... 428/901 |
| 4,961,987 | 10/1990 | Okuno et al. ................ 428/901 |

FOREIGN PATENT DOCUMENTS

| | | |
|---|---|---|
| 0026680 | 6/1983 | Japan ........................... 428/901 |
| 2176838 | 8/1987 | Japan ........................... 428/901 |
| 0117093 | 5/1989 | Japan ........................... 428/901 |
| 0155685 | 6/1989 | Japan ........................... 428/901 |
| 0155686 | 6/1989 | Japan ........................... 428/901 |
| 2179677 | 3/1987 | United Kingdom . |

OTHER PUBLICATIONS

N. Iwase et al., "Aluminum Nitride Multi-Layer Pin Grid Array Packages", proceedings Electro. Comp. Conf. pp. 384-391, Boston (1987).
H. Mandai et al, "A Low Temperature Cofired Multilayer Ceramic Substrate Containing Copper Conductors", proceedings Int. Microelec. Conf. pp. 61-64 Kobe (1986).
T. Nishimura et al., "Co-Fireable Copper Multilayered Ceramic Substrate", ibid pp. 249-254 Kobe (1986).
K. Allison et al., "Thick Film Materials for Applications on Aluminum Nitride Substrates", ibid pp. 153-160, Tokyo (1988).

Primary Examiner—Patrick J. Ryan
Assistant Examiner—Elizabeth Evans
Attorney, Agent, or Firm—Staas & Halsey

[57] ABSTRACT

An aluminum nitride circuit board included an aluminum nitride ceramic as an insulating material and a conductor circuit which is formed at least as an inner conductor and is made of at least one of gold, copper or silver.

1 Claim, 1 Drawing Sheet

ALUMINUM NITRIDE CIRCUIT BOARD

BACKGROUND OF THE INVENTION

1. Field of the Invention

The present invention relates to an aluminum nitride circuit board and a method of producing same, and more particularly, to an aluminum nitride circuit board used in a semiconductor device assembly, etc., and a method of producing same.

2. Description of the Related Art

Recently the increasingly high speed operation and integration, etc. of semiconductor devices has led to a demand for an upgrading of the properties used in these devices, circuit boards and the semiconductor package, etc.

For example, a large amount of heat is generated by a logic circuit element and thus the circuit board must have a high thermal conductivity. Further to lower thermal stress of such an element, a circuit board having a thermal coefficient of expansion very close to that of a semiconductor device is required. Furthermore, to achieve a high propagation speed, a wiring length must be shortened as much as possible, a material having a low electric resistance must be used for the circuit pattern, and an insulating material having a low dielectric constant also must be incorporated.

Among ceramic materials used for circuit boards or as a package material, the most widely-used is an alumina ceramic. An alumina ceramic has a low thermal conductivity of 20 W/mK and a thermal coefficient of expansion of about $7 \times 10^{-6}/°C.$, which is about twice that of silicon. Further, the dielectric constant of an alumina ceramic is 9 or more, and since its sintering temperature is very high, only a high melting metal such as tungsten or molybdenum can be used as the circuit pattern material in a co-firing process. A metal having such a high melting point, however, has a high electric resistance, and thus the alumina ceramic is not suitable for this purpose.

Therefore, to replace the alumina ceramic, ceramics such as an aluminum nitride ceramic, a silicon carbide ceramic, a mullite ceramic, and a low temperature firing ceramic have been developed and are now in use.

Among these ceramic materials, the silicon carbide ceramic has a thermal coefficient of expansion of $3.7 \times 10^{-6}/°C.$, which is near to that of silicon, and has a high thermal conductivity. Particularly, the silicon carbide ceramic using a beryllia as an additive has a thermal conductivity of about 270 W/mK. Nevertheless, it is difficult to form a multi-layer circuit using the silicon carbide ceramic, and further, the silicon carbide ceramic has a remarkably high dielectric constant of about 40.

The mullite ceramic has the advantages of a thermal coefficient of $4.5 \times 10^{-6}/°C.$, which is close to that of silicon, and a small dielectric constant of 7.3, but has the disadvantages of a low mechanical strength and the necessity to use a high electric resistance material such as tungsten or molybdenum as a circuit pattern material, as required by the alumina ceramic, and further, has a thermal conductivity lower than that of the alumina ceramic.

The low temperature firing ceramic has the advantages of possessing a thermal coefficient of expansion and a dielectric constant superior to that of the alumina ceramic, and materials having a low electric resistance such as gold, silver, and copper, etc. can be used as a circuit pattern material. Nevertheless, the low temperature firing ceramic has the disadvantages of an inferior mechanical strength, a low highest use temperature, and the lowest thermal conductivity among the above-mentioned materials.

As explained above, each ceramic material has advantages and disadvantages, and accordingly, an aluminum nitride ceramic will now be explained by comparison with the above ceramic materials. The aluminum nitride ceramic has a thermal coefficient of expansion of $4.5 \times 10^{-6}/°C.$, a thermal conductivity of 170 to 260 W/mK, a dielectric constant smaller than that of alumina ceramic, and a high mechanical strength. Thus, the aluminum nitride ceramic has the must balanced properties of the various ceramic materials. Nevertheless, since the aluminum nitride ceramic has a high firing temperature of 1700° C. or more, a high melting point metal must be used as the circuit pattern material in a co-firing process, for example, tungsten, which has a melting point of 3382° C. The melting points of gold, copper, and silver are, respectively, 1063° C., 1083° C., and 960.5° C., which are quite low compared with that of tungsten. Since gold, copper and silver are melted and evaporated at the usual firing temperature of an aluminum nitride ceramic they can not be used as the circuit pattern material in the co-firing thereof.

The electric resistance of a circuit pattern material can slow the signal transmission speed and cause a power loss, and the larger the dielectric constant the longer the delay in the propagation of signals when high frequency signals are transmitted in a circuit. Further, in a rectangular wave which transmits on-off signals the wave shape transmitted is deformed by the electrostatic capacity stored near the circuit and the electric resistance of the circuit material itself. The on-off signal is formed by a time of reaching a constant voltage of a rectangular wave, i.e., a threshold voltage, and when the wave shape is deformed, the time of reaching the threshold voltage is delayed, and therefore, the signal transmission speed is lowered. To prevent this deformation of the transmission wave shape, it is necessary to lower the electrostatic capacity near the circuit pattern, (in other words, the dielectric constant near the circuit pattern) and to make the value of electric resistance of the circuit pattern material low. The signal delays in each circuit pattern are a serious problem, since a large number of computing operations are carried out at a high speed in a logic circuit.

Since a conventional aluminum nitride circuit board or package has a high electric resistance of circuit pattern material, e.g., tungsten etc. in spite of superior properties of the ceramic board itself, the high speed transmission of signals in a device cannot be made higher than in a conventional alumina ceramic package.

SUMMARY OF THE INVENTION

An object of the present invention is to provide an aluminum nitride circuit board wherein gold, copper, or silver and the like having a low electric resistance can be used as a circuit pattern material and thus a high speed transmission of signals in a device can be realized.

Another object of the present invention is to provide a method of producing the aluminum nitride circuit board mentioned above.

According to the present invention there is provided an aluminum nitride circuit board comprising an aluminum nitride ceramic as an insulating material and a conductor circuit made of at least one of gold, copper and silver.

There is further provided a method of producing an aluminum nitride circuit board comprising the steps of: forming a green sheet using an aluminum nitride as a raw material powder, providing a circuit pattern of at least one of gold, copper and silver on the green sheet, laminating a green sheet on the conductor pattern, and firing the laminated green sheets at a temperature elevation rate of 20° C./min or more in a non-oxidizing atmosphere.

DESCRIPTION OF THE PREFERRED EMBODIMENTS

Figure 1:
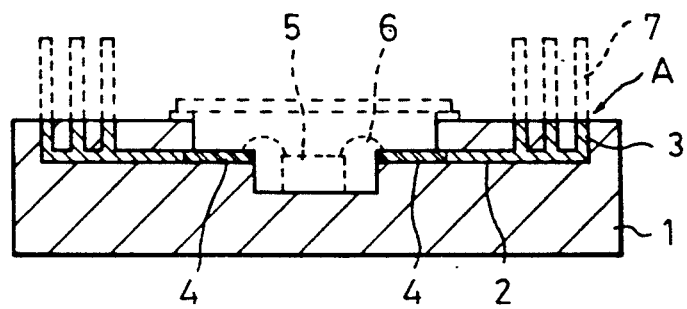
FIG. 1 shows an example of an aluminum circuit board according to the present invention.

Before describing the preferred embodiments, the properties of aluminum nitride and gold, copper, and silver will be explained.

The inventors considered that aluminum nitride is chemically stable and has a poor wetting nature to molten metal, it has very high speed of densification in a sintering process, compared to other ceramic material and that gold, copper or silver have a relatively low vapor pressure. Accordingly, the inventors realized that, in an aluminum ceramic, a conductor circuit pattern of gold, copper or silver could be used by co-firing therewith. When an aluminum nitride ceramic is co-fired together with gold, copper or silver at the same time, the gold, copper or silver are melted and liquefied at a temperature of 1100° C. or less.

On the other hand, the densification of the aluminum nitride in the firing starts at a temperature of 1300° C. or more. Accordingly, the following problems arise:

(a) Evaporation of melted and liquefied metal, (b) Penetration of liquid metal into the interface of aluminum nitride grains due to a capillary effect, (c) Penetration of melted metal in the direction of the force of the gravity due to a large specific weight of the melted metal, (d) Chemical reaction of the melted metal with the aluminum nitride or additive composition, (e) Difference between the volume changes of the metal and the aluminum nitride in all processes, (f) Difference between coefficients of the thermal expansion of the metal and the aluminum nitride ceramic (g) Solving of the aluminum nitride or the additive composition into the melted metal.

Among the above-mentioned problems, the penetration of melted metal into aluminum nitride by a capillary effect is not generated, since the aluminum nitride has a high non-wetting property. Further, the difference of the coefficients of thermal expansion of the metal and the aluminum nitride ceramic relating to (f) is a problem from solidification of metal. The thermal expansion coefficient of metal is comparatively large compared with that of the aluminum nitride. Namely, for example, the thermal expansion coefficients of gold, copper and silver are respectively $14.4 \times 10^{-6}/°C$., $20.0 \times 10^{-6}/°C$. and $19.2 \times 10^{-6}/°C$. and the thermal expansion coefficient of the aluminum nitride is $4.5 \times 10^{-6}/°C$. This problem also arises when using gold or copper and silver as a circuit material formed in a low temperature firing ceramic, but since metal has a good ductility, breakage of the circuit and warpage of the ceramic board cannot occur.

When the evaporation of melted metal relating to (a) is considered, this occurs at a non-equilibrium state in the materials.

From a view point of an equilibrium vapor pressure, gold has a pressure below about 7 mmHg and copper has a pressure below about 5 mmHg at a temperature of 1800° C., which is relatively low, and silver has an equilibrium vapor pressure of about 60 mmHg. In these metals, even though the environment pressure is the same as the atmospheric pressure, such metals are not early decreased.

At last, the chemical reaction of melted metal and an additive composition and solution of the melted metal ((d) and (g)) are known to be not effected at a temperature of about 1000° C. after sufficient densification of aluminum nitride ceramic; however, there had been no information regarding the interactions mentioned as (d) and (g) at the temperature higher than 1000° C. with the aluminum nitride body which is not densified.

From the point of view of the above problems the present inventors experimented with a co-firing process using an aluminum nitride green sheet and a metal paste of gold, copper or silver or a metal foil, under various conditions, and obtained the following findings.

First, it is preferable to use a high purity material as the metal material used for forming the conductive circuit, because when a metal material contains many impurities, the melting point of the metal material is lowered and thus a large difference arises between the melting point temperature and the temperature at which densification of an aluminum nitride begins. Also, the wetting characteristic of the metal material with aluminum nitride powder is changed so that it is possible for melted metal to easily penetrate the aluminum nitride.

When the metal paste is used the paste for frit bonding and chemical bonding is not preferable.

Further, preferably the aluminum nitride powder has a small grain size, for example, at least 2 μm or less, to accelerate the densification speed. Further, to decrease a mutual interaction with melted metal, a high purity aluminum nitride is most advantageous.

An organic binder, plasticizer, or organic solvent, etc. can be added to an aluminum nitride powder in the above-mentioned condition to form a slurry. In this case, to accelerate the densification speed and to lower the starting temperature of the densification a sintering additive is added.

As the sintering additive, one from the chemical periodic table IIa group or IIIa group compound, or a mixture thereof is added, but as little as possible of the additive should be added.

When the firing temperature is 1700° C. or more, a IIa group compound, particularly a calcium compound, is preferably added separately at an amount of preferably 1% or less by weight. The slurry is formed as a green sheet by a doctor blade process. The green sheet needs to have high density so that penetration of melted metal to an aluminum nitride is prevented, and the densification speed of aluminum nitride in molding can be increased with the dense green sheet.

To increase the density of the green sheet, it is important to add a small amount of the binder and plasticizer to be fired, to increase filling density of inorganic composition itself, to increase a dispersion of the inorganic powder in the slurry, and to control the sheet casting speed and drying conditions. Even when green sheets are stacked it is necessary to increase the density of the stacked or laminated body. Thus the green sheet is preferably laminated at a temperature of 50° C. or more and a pressure of 100 kg/cm$^2$ or more, using a thermal compression process.

When a circuit pattern is provided on a green sheet, a circuit pattern of metal foil in which an etching treatment is carried out, or a circuit pattern formed by screening a metal paste, is used. Further, when a via hole is provided in a board etc., a through hole provided in a green sheet is filled with a metal paste and the green sheet is laminated thereafter.

In a green sheet having a via hole a metal portion is exposed at a surface of a board. Thus, to prevent the exposition of the metal portion from a board surface a green sheet is further stacked on the surface thereof. Among the circuit patterns formed on a green sheet, tungsten or a mixture of tungsten and gold or copper is preferably used as an exposed outer circuit such as a bonding portion. When copper is used as a circuit material, the removal of a binder composition added to a green sheet must be effected in a non-oxidizing atmosphere, but when gold or silver is used, the removal of the binder can be effected at a highest temperature of 500° C. in the atmosphere, using an aluminum nitride obtained in a reduction nitriding process.

When firing an AlN green sheet, a setter having a main composition of boron nitride is preferably used in a non-oxidizing atmosphere, preferably a nitrogen gas atmosphere under 1 atm. The temperature elevation rate of the green sheet should be 20° C./min or more at a temperature of 900° C. or more, since if the temperature elevation rate is lower than 20°/min, good results cannot be obtained.

Further, the most suitable firing temperature is changed by a used circuit material. For example, in the case of gold and copper, the most suitable firing temperature is about 1800° C., but in the case of silver, about 1600° C. is preferable. Under the temperature the degree of density is not sufficient and above 1700° C. fired body has many bulging portions. Further, a comparatively large amount of silver is unpreferably lost.

When the above-mentioned paste of tungsten or a mixture of tungsten and gold or copper is used as an outer circuit portion of a board, good results can be obtained under the above firing temperature conditions, but when gold, copper or silver are independently used as a circuit at an exposed portion of a board, the gold or copper will be formed in a separated ball shape and the silver will almost disappear under the above firing conditions.

After cutting the obtained sintered body, the inner conductor circuit of the body was observed, and the present inventors found that penetration of metal into the aluminum nitride ceramic had not occurred, and that the metal structure had a more uniform structure without inclusions than in a conventional one.

Regarding the use of gold as a circuit, a composition of a ceramic composition, particularly a sintering additive, was comparatively mixed with gold during firing particularly melting, and the inherent color of gold was lost and a silver color appeared in a conductive circuit portion after sintering. The mixing of the sintering additive with gold was effected even though the highest holding temperature was changed. Further, the mixing was also observed independent of whether the sintering additive was a IIa group oxide or IIIa group oxide. When the additive is mixed with gold, a value of an electric resistance of a conductive circuit portion becomes greater compared with pure gold. Thus, the selection of a type of sintering additive is important. For example, a calcium compound has a superior electric property to a yttrium compound.

The value of the electric resistance in the case of gold, however, becomes lower than that of a conductive circuit portion made of conventional tungsten or molybdenum.

On the contrary, when copper is used as a circuit material a mixing of the sintering additive composition is not carried out and the color of the inner conductor is that inherent to copper having a superior electric property.

From the above-explained behavior of gold, copper, silver and additives during the firing process, the properties of an obtained ceramic and conductor circuit, and the cost, etc., it appears that copper is the most preferable. However, as an outer circuit material, a mixture of tungsten and gold is superior to that of tungsten and copper, since the former has a stronger adhesion strength.

In a firing process, a sintering additive composition is mixed with gold as mentioned above. The behavior corresponding to a temperature change to 1800° C. is explained below where gold is used as the circuit material:

| | |
|---|---|
| ∘ 898° C. - | Decomposition of calcium carbonate, formation of CaO. Emission of $CO_2$ to outside of fired body. |
| ∘ - 1000° C. | Emission of remaining carbon from the body to outside. |
| ∘ 1063° C. - | Melting of gold. |
| ∘ About 1300° C. - | Formation of calcium aluminate. |
| ∘ - 1800° C. | Mixing of Ca, Al particularly Ca with gold. Gradual increase of evaporation of gold. Densification of aluminum nitride Emission of Ca, Al, Au, O, etc., from ceramic As a ceramic, particularly one positioned around melted gold becomes densified the movement of the gold is limited. Grain growth of aluminum nitride. As a compression of ceramic during firing a pressure pressed on a melted gold. |
| ∘ 1800° C. (held) | Firing shrinkage saturation, grain growth of aluminum nitride and emission of grain-boundary phase composition from a ceramic. |
| ∘ - room temperature | Shrinkage of ceramic volume in lowering temperature. |

Concrete examples are now described.

EXAMPLE 1

To an aluminum nitride powder having an average grain size of about 1 μm and obtained by a reducing nitriding process, calcium carbonate having an amount of 0.5% by weight with CaO conversion as a sintering additive, an organic binder, a plasticizer and an organic solvent were added to make a slurry, and green sheets having a thickness of about 0.4 mm by a doctor blade process were formed. A copper paste made of a copper powder having a grain size of about 1 to 2 μm was printed on the green sheet by a screen printing process and dried.

Then, another aluminum nitride green sheet having no printed copper paste was stacked on the copper paste printed green sheet and thermally contact-bonded (laminated) at a temperature of 60° C. for 5 minutes under a pressure of 200 kg/cm$^2$.

After eliminating the binder of the laminated green sheets in a nitrogen gas atmosphere they were fired at a heating rate of 30° C./min, a highest temperature of 1800° C., a holding time of 3 hours. They were experimented while the pressure of the nitrogen gas atmosphere was changed, for example, to atmospheric pressure, to 5 kg/cm$^2$, and to 9 kg/cm$^2$. In any case of the nitrogen gas pressure dense and translucent white sintered body could be obtained. The sintered body was cut, and the inner circuit portion thereof observed, and it was found that the inner conductor had a uniform structure and exhibited a color similar to that inherent to copper.

EXAMPLE 2

An aluminum nitride green sheet formed in the same manner as in Example 1 was used, except that yttrium oxide 3% by weight was added thereto as a sintering additive. They were fired under the same conditions as in Example 1, except that the nitrogen gas was changed to an atmospheric pressure.

The obtained sintered body had the same appearance as that obtained in example 1, and had an uniform structure inner conductor exhibiting a color inherent to copper.

EXAMPLE 3

To an aluminum nitride powder having an average grain size of about 1 μm obtained by a reducing nitriding process, calcium carbonate in an amount of 1.0% by weight with a CaO conversion and yttrium oxide in an amount of 1% by weight were added as a sintering additive, and an aluminum nitride green sheet was produced. Then, after screen printing using the same copper paste as used in Example 1, the green sheet was fired under the same conditions at a highest temperature of 1700° C.

The thus obtained sintered body had the same appearance as that obtained in Example 1, and the inner conductor thereof was uniformly formed.

EXAMPLE 4

The same aluminum nitride green sheet as used in Example 1 was used, except that 1.0% by weight of calcium carbonate with a CaO conversion was used. Through holes were formed in the green sheet, and the holes were filled with the same copper paste as used in Example 1. Four green sheets in which through holes were also filled with copper paste were stacked. Further, on the uppermost surface and on the lowermost surface, a green sheet having no copper printing was thermally contact-bonded.

The thus obtained sintered body was fired under the same conditions as used in Example 2. After polishing the surface of the body and exposing via conductors, the via conductors having the same uniform structure as of Examples 1 to 3 were observed to be formed in the body.

EXAMPLE 5

A copper foil having a thickness of 0.035 mm and purity of 99.8% or more, in which a 300 μm width circuit pattern was formed by an etching process, was sandwiched by the same aluminum nitrides as in Example 1, except that 1.0% by weight of calcium carbonate with a CaO conversion. After the obtained sandwiched structure was thermally contact bonded monolithically it was fired under the same conditions as used in Example 2.

The obtained sintered body was cut and polished to observe the structure of the conductor circuit, and as a result it was found that a good inner conductor was formed.

EXAMPLE 6

On the same aluminum green sheet containing 1.0% by weight of calcium carbonate with CaO conversion as a sintering additive as used in Example 1, an inner conductor circuit and an outer conductor circuit were formed respectively using the same copper paste as used in Example 1, and a mixed paste of copper powder having a grain size of 1 to 2 μm and a tungsten powder having an average grain size of 1.1 μm, the mix ratio of copper powder to tungsten powder being 20 to 80. The inner conductor circuit portions are, for example, plane patterns and via portions etc. not exposed outside the board.

The thus obtained stacked body was thermally contact bonded and debindered, and then fired under the same conditions.

The outer circuit portion of the sintered body had no bulging and had uniform metal structure, and the inner circuit portions of a via portion and a plane pattern portion had a uniform structure. In the laminated body of this example, a via edge surface can be exposed by flatly polishing of the sintered body.

EXAMPLE 7

On the same aluminum nitride green sheet as used in Example 1, a gold paste in which an inorganic composition consists of merely gold was screen printed. Then, after drying the green sheet, on a surface of the green sheet having the printed surface to be the inside, a further green sheet on which a gold paste was not screen printed was stacked. After thermally contact bonding it was debindered and fired under the same conditions as used in Example 1.

The obtained sintered body exhibited a translucent white color so that the inner circuit pattern was observed. The sintered body was cut and recognized that the inner conductor had a uniform white silver color metal structure without inclusions.

When the interface between the ceramic and the metal was analyzed by an X ray microanalyzer, a small amount of aluminum other than calcium, nitrogen, and oxygen were detected in the metal portion. The amount of calcium contained in the metal portion was larger than that of the calcium contained in a ceramic, and therefore, it appears that the calcium is selectively melted into the metal.

EXAMPLE 8

On the same aluminum nitride green sheet as obtained in Example 1, except that a 3% by weight of yttrium oxide was contained as a sintering additive, a gold paste was screen printed, and the obtained green sheet was fired under the same conditions as used in Example 7.

The obtained sintered body exhibited the same appearance as of the other examples and the inner conductor also exhibited a silver white color by mixing of sintering additive as explained in Example 7.

EXAMPLE 9

A laminated body was formed by using an aluminum nitride green sheet and a gold paste as used in Example 8, and fired at a highest temperature of 1700° C., for a holding time of three hours at a heat up rate of 30° C./min in a nitrogen gas under an atmospheric pressure.

The inner the appearance of obtained sintered body had the same results as explained in Example 7.

EXAMPLE 10

On the same aluminum green sheet as used in Example 6, an inner conductor circuit and an outer conductor circuit were formed by using the same copper paste as used in Example 1, and a mixed paste of gold and tungsten powder having an average grain size of 1.1 μm; the mixed ratio of gold to tungsten being 40 to 60.

The copper paste was used as a plane circuit pattern portion and a via circuit portion which are not exposed out of the board, and the mixed paste was used as an outer conductor circuit portion.

The thus formed stacked body was thermally contact-bonded and debindered, and then fired under the same conditions as used in Example 1, in a nitrogen gas atmosphere under an atmospheric pressure.

The outer conductor circuit portion of the sintered body had no bulging and had a uniform and silver color structure having a metallic luster. Further, the via hole and the plane pattern portion using copper paste had a uniform structure. When comparing example 6 with Example 10, the bonding strength of the outer conductor circuit portion in Example 10 where gold-tungsten mixed paste was used better than in Example 6.

EXAMPLE 11

Using the same material and conditions as in Example 1, except that a paste whose inorganic composition is merely silver a firing was carried out.

The obtained sintered body had bulging at a portion where inner conductor portions are provided. Further in observing a cut surface of the sintered body it was found that an inner conductor portion does not form uniform structure and that a large amount of silver was lost.

EXAMPLE 12

Firing was carried out under the same conditions as in Example 11, except that the highest temperature was 1700° C., the temperature elevation rate was 35° C./min, and the nitrogen gas atmosphere pressure was 9 kg/cm$^2$.

A number of voids were observed in the inner conductor of the obtained sintered body.

EXAMPLE 13

Firing was carried out under the same conditions as in Example 11, except that the highest temperature was 1600° C. and 1.0% by weight of calcium carbonate with a CaO conversion and 1.0% by weight of yttrium oxide were added as additives.

The inner conductor of the obtained sintered body had no voids. Thus, an aluminum nitride circuit board using gold, copper, and silver were explained. Next, concrete examples of packages using the aluminum nitride circuit board will be described with reference to FIGS. 1 to 3.

Figure 2:
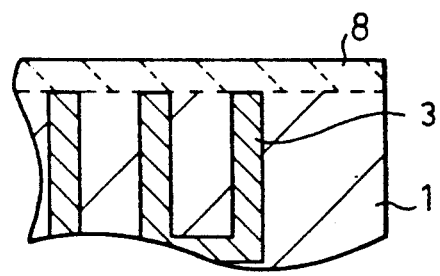
FIG. 2 is an enlarged explanatory view of a portion A of FIG. 1.

FIG. 1 is an example of an aluminum circuit board according to the present invention, and FIG. 2 is an enlarged explanatory view of a portion A of FIG. 1.

In FIG. 1, a package body I of an aluminum nitride has inner circuit patterns 2 and 3 made of copper. Particularly, the pattern 2 is a plane pattern portion and the pattern 3 is a via portion. An exposed outer circuit portion 4, which is an inner lead, is made of a mixed paste of gold and tungsten. The outer circuit portion 4 forms a conductor circuit while connecting to the plane pattern portion 2. The connecting portion between the outer circuit portion 4 and the plane pattern portion 2 is provided so that it is slightly extended in the package laminate whereby copper melted during a firing is prevented from emitting out. At the center of the package 1, a silicon device 5 is attached and is connected to bonding wires 6. Further, outer lead pins 7 are connected to the inner circuit patterns 3.

On an upper surface of the package body 1 of aluminum nitride in FIG. 2, an aluminum nitride layer 8 is covered so as not to be exposed and fired. Before arranging an outer lead 7, the surface of the package 1 is polished to be exposed in the conductor circuit portion.

Figure 3:
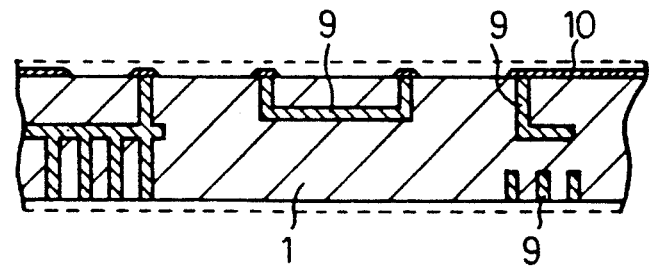
FIG. 3 is another example of an aluminum circuit board according to the present invention.

FIG. 3 shows another example of an aluminum nitride circuit board. An inner circuit portion 9 is provided in a package body 10. In this example the upper and lower surface of the board is covered by aluminum nitride layers (shown by broken line) and fired and further polished so that the inner circuit portion 9 is exposed on the surface of the circuit board. Then a thin film conductor pattern is formed on the surface of the polished board by a vapor deposition method. The conductor pattern can be also formed by connecting a copper foil to the board and etching, or by screen printing it thereon.

In above-mentioned examples, gold, copper or silver are individually used as the circuit pattern material, but at least two elements of the gold, copper and silver can be used in making the paste.

Further, as a circuit material, different metal materials can be used at the same time. For example, a gold circuit material can be used as one conductor circuit portion and a copper circuit material used as another conductor circuit.

According to the present invention, a conductor circuit of gold, copper or silver having a low electric resistance can be formed by cofiring. Therefore, a low power loss, a high rate of signal propagation, a high thermal conductivity, and a low coefficient of thermal expansion can be obtained, simultaneously.

We claim:
1. A circuit board comprising:
   a first green sheet containing aluminum nitride power and a sintering agent;
   a conductor circuit made of at least one of gold, copper and silver printed on a surface of the green sheet; and
   a second green sheet containing aluminum nitride power stacked on the surface of the first green sheet which includes the conductor circuit, said first and second green sheets and said conductor circuit being heat treated sufficiently to form a laminated structure, said laminated structure being fired to form a sintered body containing the conductor circuit therein.

* * * * *